US010224186B2

(12) United States Patent
Polak et al.

(10) Patent No.: US 10,224,186 B2
(45) Date of Patent: Mar. 5, 2019

(54) PLASMA SOURCE DEVICE AND METHODS

(71) Applicant: Advanced Energy Industries, Inc., Fort Collins, CO (US)

(72) Inventors: Scott Polak, Fort Collins, CO (US); Daniel Carter, Fort Collins, CO (US); Karen Peterson, Loveland, CO (US); Randy Grilly, Pierce, CO (US); Mike Thornton, Loveland, CO (US); Daniel J. Hoffman, Fort Collins, CO (US)

(73) Assignee: AES Global Holdings, PTE. LTD, Singapore (SG)

(*) Notice: Subject to any disclaimer, the term of this patent is extended or adjusted under 35 U.S.C. 154(b) by 306 days.

(21) Appl. No.: 15/067,060

(22) Filed: Mar. 10, 2016

(65) Prior Publication Data

US 2016/0268104 A1 Sep. 15, 2016

Related U.S. Application Data

(60) Provisional application No. 62/133,164, filed on Mar. 13, 2015.

(51) Int. Cl.
*H05H 1/42* (2006.01)
*C23C 16/50* (2006.01)
*H01J 37/32* (2006.01)
*C23C 16/455* (2006.01)
*C23C 14/00* (2006.01)

(52) U.S. Cl.
CPC ...... *H01J 37/32532* (2013.01); *C23C 16/455* (2013.01); *C23C 16/50* (2013.01); *H01J 37/3244* (2013.01); *H01J 37/32357* (2013.01); *C23C 14/0063* (2013.01); *H05H 1/42* (2013.01)

(58) Field of Classification Search
None
See application file for complete search history.

(56) References Cited

U.S. PATENT DOCUMENTS

| 5,076,051 | A | * | 12/1991 | Naff ........................ H05H 1/34 219/121.51 |
| 5,296,672 | A | * | 3/1994 | Ramakrishnan ....... H05B 7/185 219/121.48 |
| 6,150,628 | A | | 11/2000 | Smith et al. |
| 6,156,667 | A | | 12/2000 | Jewett |

(Continued)

FOREIGN PATENT DOCUMENTS

KR 101406696 B1 6/2014

OTHER PUBLICATIONS

Kim, Sung Gon, "International Search Report and Written Opinion re Application No. PCT/US2016/021878", dated Jun. 27, 2016, p. 13 Published in: KR.

(Continued)

*Primary Examiner* — Binu Thomas
(74) *Attorney, Agent, or Firm* — Neugeboren O'Dowd PC

(57) ABSTRACT

This disclosure describes a remote plasma source, a gas input manifold, and related methods of making and using. In some examples, a remote plasma source is provided with a plasma chamber, a gas input manifold, and an output region. The remote plasma source also has means for introducing a gas into the plasma chamber, the means for introducing configured to impart a radial velocity and a longitudinal velocity on the gas, relative to a longitudinal axis through the remote plasma source.

20 Claims, 15 Drawing Sheets

(56) References Cited

U.S. PATENT DOCUMENTS

| | | |
|---|---|---|
| 6,291,938 B1 | 9/2001 | Jewett et al. |
| 6,326,584 B1 | 12/2001 | Jewett et al. |
| 6,388,226 B1 | 5/2002 | Smith et al. |
| 6,392,210 B1 | 5/2002 | Jewett et al. |
| 6,486,431 B1 | 11/2002 | Smith et al. |
| 6,552,296 B2 | 4/2003 | Smith et al. |
| 6,559,408 B2 | 5/2003 | Smith et al. |
| 6,724,148 B1 | 4/2004 | Gonzalez et al. |
| 6,819,096 B2 | 11/2004 | Gonzalez et al. |
| 6,822,396 B2 | 11/2004 | Gonzalez et al. |
| 6,927,358 B2 | 8/2005 | Gonzalez et al. |
| 6,946,063 B1 | 9/2005 | Gonzalez et al. |
| 7,005,845 B1 | 2/2006 | Gonzalez et al. |
| 7,015,415 B2 | 3/2006 | Gorin |
| 7,245,084 B1 | 7/2007 | Gonzalez et al. |
| 7,375,302 B2 | 5/2008 | Twarog et al. |
| 7,468,494 B2 | 12/2008 | Gonzalez et al. |
| 8,893,651 B1 | 11/2014 | Biberger et al. |
| 9,293,302 B2 | 3/2016 | Risby et al. |
| 2003/0015293 A1* | 1/2003 | Obuchi ............ H01J 37/32082 156/345.48 |
| 2004/0149701 A1 | 8/2004 | Gonzalez et al. |
| 2008/0142057 A1* | 6/2008 | Yan .................. H01J 37/32357 134/198 |
| 2012/0187844 A1 | 7/2012 | Hoffman et al. |
| 2012/0242229 A1 | 9/2012 | Hoffman et al. |
| 2013/0001196 A1* | 1/2013 | Hoffman ........... H01J 37/32357 216/67 |
| 2014/0159572 A1* | 6/2014 | Risby ................ H01J 37/32357 315/39.51 |
| 2014/0197136 A1* | 7/2014 | Nagorny ........... H01J 37/32357 216/68 |
| 2014/0210345 A1 | 7/2014 | Hoffman |
| 2015/0225833 A1 | 8/2015 | Kowalsky et al. |
| 2015/0279631 A1* | 10/2015 | Hoffman ........... H01J 37/32357 315/111.21 |
| 2015/0287573 A1 | 10/2015 | Taskar et al. |
| 2016/0097119 A1 | 4/2016 | Cui et al. |
| 2016/0163512 A1 | 6/2016 | Lubomirsky |
| 2016/0163513 A1 | 6/2016 | Lubomirsky |
| 2017/0231078 A1 | 8/2017 | Gomaa et al. |

OTHER PUBLICATIONS

Joo-Seung Kim, "The Korean Intellectual Property Office Notice of Grounds for Rejection Regarding KR Patent Application No. 10-2017-7016728", dated May 30, 2018, pp. 8, Published in: KR.

Nickitas-Etienne, Athina, "PCT International Preliminary Report on Patentability Regarding International App. No. PCT/US2016/021878", dated Sep. 28, 2017, p. 8 Published in: WO.

* cited by examiner

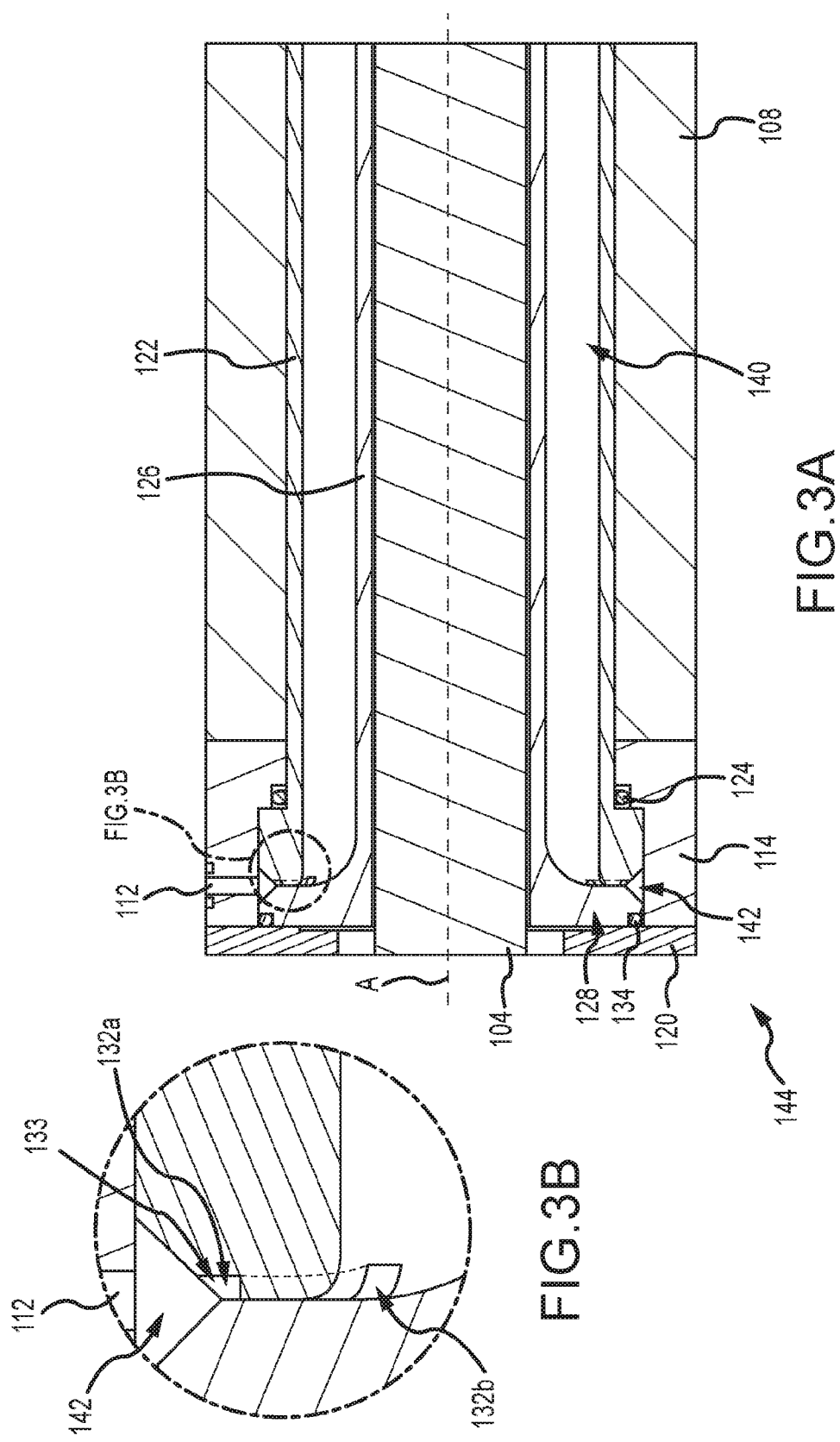

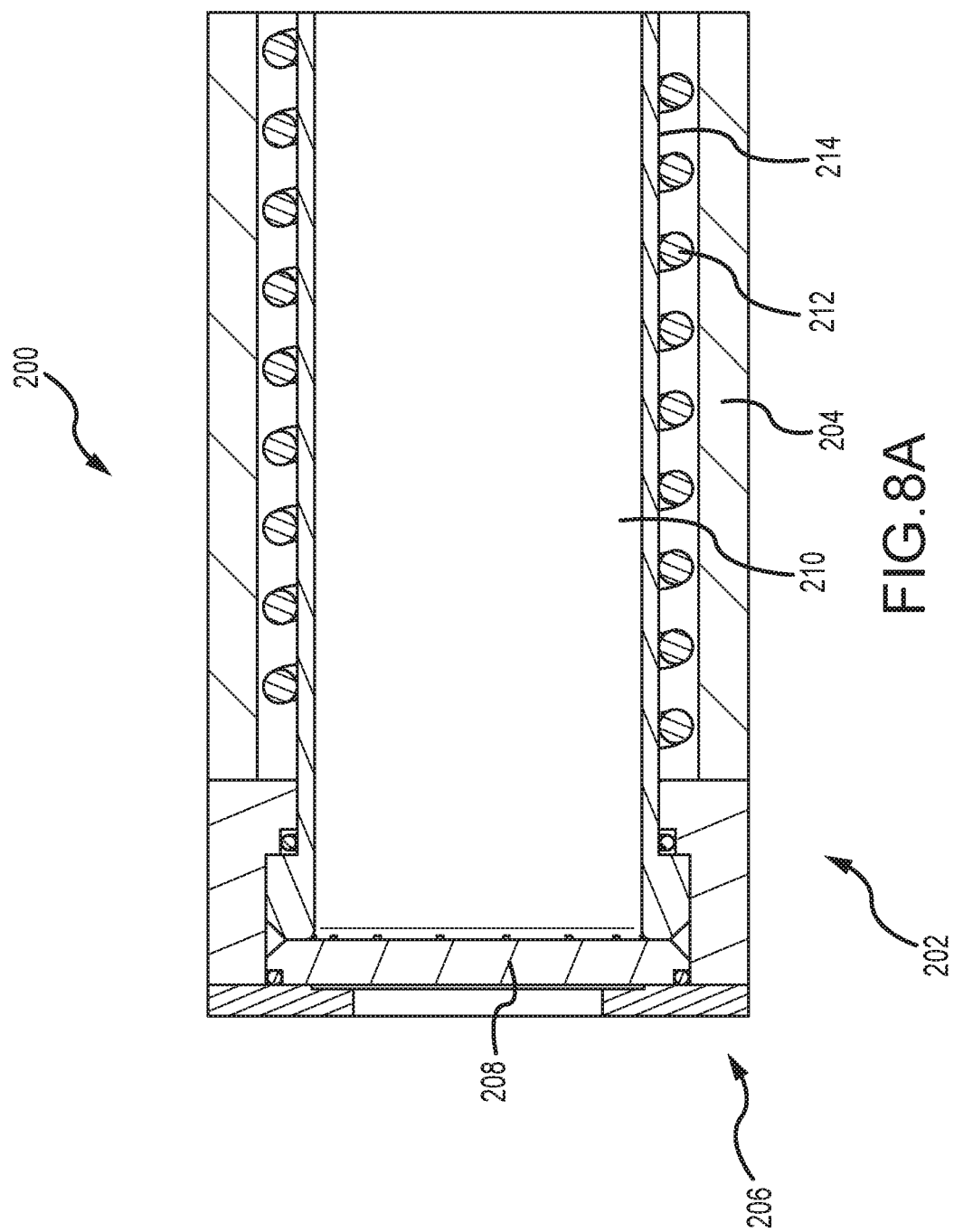

PLASMA SOURCE DEVICE AND METHODS

PRIORITY

The present application is a non-provisional patent claiming the benefit of U.S. Patent Application No. 62/133,164 entitled "Plasma Source Device and Methods" and filed Mar. 13, 2015 and assigned to the assignee hereof and hereby expressly incorporated by reference herein.

FIELD OF THE INVENTION

The present invention relates generally to plasma processing. In particular, but not by way of limitation, the present invention relates to plasma source devices and methods.

BACKGROUND OF THE INVENTION

A plasma source is a device which transforms a feed gas or gases into a quasi-neutral, non-thermal plasma, by means of an externally applied electric/electromagnetic field. In the process of transforming gas into plasma, the gas particles can be excited, ionized, and/or dissociated. All of these aforementioned transformation processes are sensitive to: pressure, density, and residence time (the time spent in the applied electric field). The semiconductor and any thin film application may benefit from improved plasma source devices and methods.

SUMMARY

Embodiments disclosed herein address the above stated needs by providing a plasma source device or method according to any of the examples or embodiments described herein. It is to be understood, however, that there is no intention to limit the invention to the forms described in this Summary of the Invention or in the Detailed Description One skilled in the art can recognize that there are numerous modifications, equivalents and alternative constructions that fall within the spirit and scope of the invention as expressed in the claims.

In one example, a remote plasma source is provided. The remote plasma source is configured to transform a gas passing therethrough into a plasma. The remote plasma source has an enclosure defining a plasma chamber. The enclosure is configured to isolate the gas from external atmosphere, as the gas is transformed into the plasma and comprising an output passage configured to deliver constituents of the plasma from the plasma chamber. The remote plasma source has a gas input manifold coupled to the enclosure and configured to introduce the gas into the plasma chamber. A longitudinal axis extends through the gas input manifold and through the plasma chamber. The gas input manifold comprises a gas entry port in a manifold body, a gas chamber, and a plurality of channels. The gas entry port is configured to couple to a gas supply and to introduce the gas to the gas chamber. The plurality of channels are configured to direct the gas from the gas chamber downstream to the plasma chamber and to impart a radial velocity and a longitudinal velocity on the gas as the gas passes through the plurality of channels.

In another example, a remote plasma source having a plasma chamber, a gas input manifold, an output region, and means for introducing a gas into the plasma chamber is provided. The means for introducing a gas is configured to impart a radial velocity and a longitudinal velocity on the gas, relative to a longitudinal axis through the remote plasma source.

In another example, a remote plasma source is provided. The remote plasma source (RPS) has a gas input section for receiving a process gas, and a plasma region downstream of the gas input section, for transforming the process gas into a plasma. The RPS has an output section downstream of the plasma region, for releasing constituents of plasma formed by the plasma region, and a housing comprising an enclosure and a manifold body upstream of the enclosure. The manifold body has a gas entry port for receiving a process gas. The RPS has a cylindrical inner electrode having a length along a longitudinal axis and extending from the gas input section towards the plasma region. The RPS has an electrode insulator having a cylindrical recess for receiving the inner electrode and an outer profile having a flanged region upstream of a cylindrical outer surface, and an enclosure insulator disposed about the cylindrical outer surface of the inner electrode to form a plasma chamber between the outer surface of the inner electrode and an inner surface of the enclosure insulator. The enclosure insulator further has a flanged region positioned against the flanged region of the electrode insulator. At least one of the flanged region of the electrode insulator or the flanged region of the enclosure insulator comprises a plurality of grooves therein, whereby a plurality of channels is formed between the flanged region of the electrode insulator and the flanged region of the enclosure insulator. A portion of the manifold body is disposed about the flanged regions of the electrode insulator and the enclosure insulator, whereby a gas chamber is formed between the manifold body, the electrode insulator, and the enclosure insulator. The plurality of gas channels are in fluid communication with the gas chamber and the plasma chamber. The plurality of channels extend radially and longitudinally relative to the longitudinal axis. The plurality of channels are configured to impart a radial velocity and a longitudinal velocity on the gas as the gas is fed towards the plasma chamber.

BRIEF DESCRIPTION OF THE DRAWINGS

Various objects and advantages and a more complete understanding of the present invention are apparent and more readily appreciated by referring to the following detailed description and to the appended claims when taken in conjunction with the accompanying drawings:

FIG. 3A a side section view of the remote plasma source in FIG. 1;

FIG. 3B is a detailed view of some features illustrated in FIG. 3;

FIG. 8A is a side section view of an exemplary 200;

DETAILED DESCRIPTION

The word "exemplary" is used herein to mean "serving as an example, instance, or illustration." Any embodiment described herein as "exemplary" is not necessarily to be construed as preferred or advantageous over other embodiments.

Before describing the details of various embodiments herein, it is first beneficial to consider the overall problems and objectives behind the design. As previously described in the background of this disclosure, a plasma source is a device which transforms a feed gas or gases into a quasi-neutral, non-thermal plasma, by means of an externally applied electric/electromagnetic field. The plasma source is often used in semiconductor production or other thin film applications. Commonly, a feed gas (or gases) is supplied to a chamber, such as a cylindrical chamber, and transformed into a plasma. Transforming gas into plasma may be achieved by ionizing some portion of the gas through inelastic collisions between electrons and gas particles. Additionally, within a plasma, other collisions between particles may result in excitation or dissociation if molecular in nature.

All of these aforementioned transformation processes are sensitive to a number of variables, including pressure, density, and residence time (the time spent in the applied electric field) of the distinct gas particles. Moreover, within a given chamber, variations in the pressure, density, and speed of the distinct particles at distinct points in the chamber result in variations in the plasma itself. In short, plasma is sensitive to fluid behavior. Some embodiments disclosed herein provide a plasma source that provides a more uniform plasma than is currently available.

Some embodiments disclosed herein provide a plasma chamber having a gas source that is fed to the chamber in a manner that imparts a more consistent residence time on the particles and promotes increased diffusion of ingress gas density and momentum as compared to currently-available devices.

In some embodiments, a remote plasma source is provided that creates a scrolling or swirling pattern of gas as the gas moves through the chamber and is changed into a plasma. In some embodiments, a gas input manifold is provided, that distributes gas through discrete orifices or channels, to impart a more uniform pressure and/or density and/or velocity of particles making up the gas.

Figure 1:
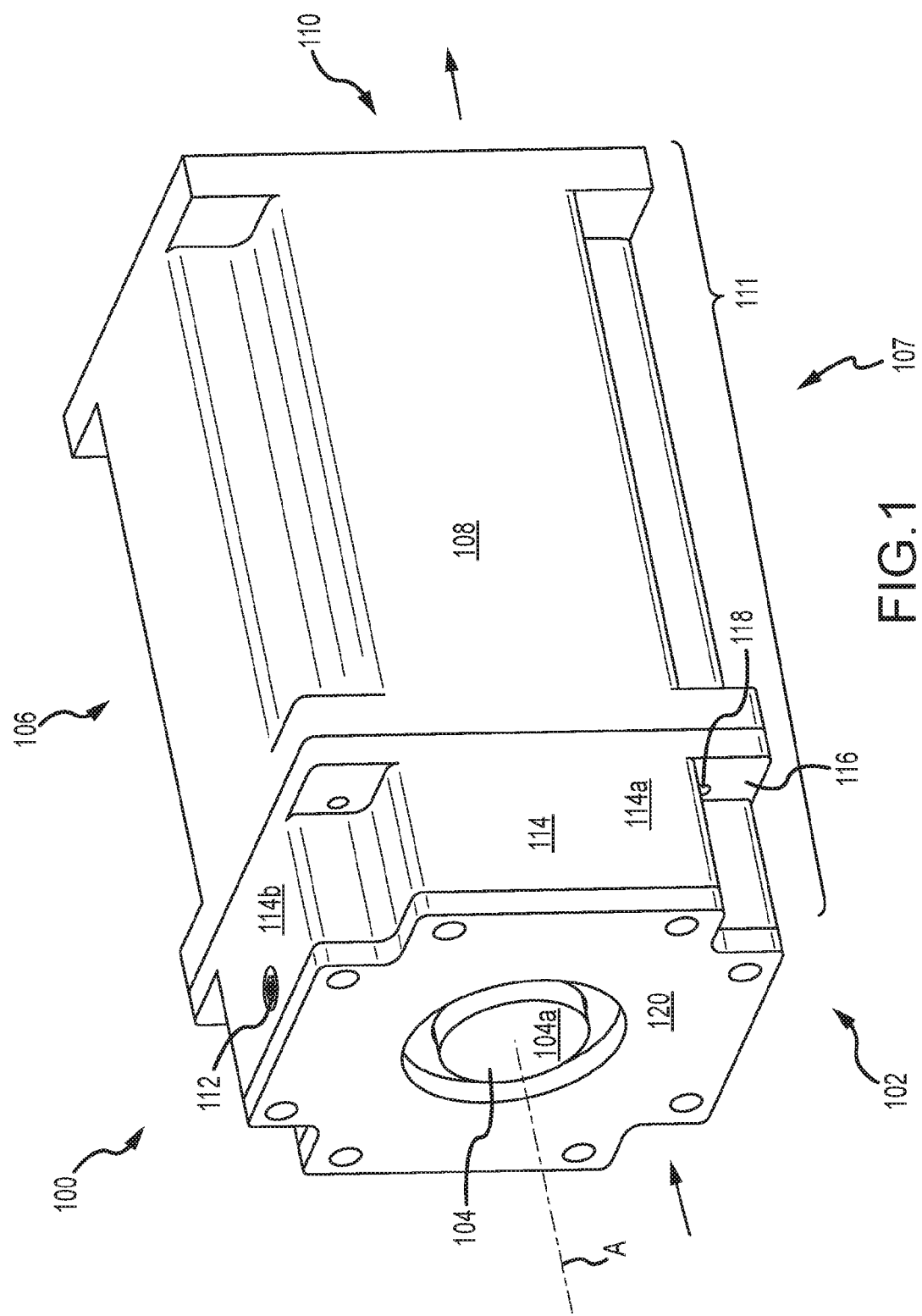
FIG. 1 is a perspective view of an exemplary remote plasma source.

Turning now to FIG. 1, it illustrates a general perspective view of an exemplary remote plasma source 100. The remote plasma source 100 may have a gas input manifold 102, a gas, an electrode 104 extending through the gas input section 102 and into a plasma region 107, which may have a plasma chamber 106 defined by an enclosure 108 or ground plane, which may be aluminum. Those skilled in the art will readily recognize that not all elements of the remote plasma source 100 are illustrated in FIG. 1; for example, a cooling coil is not illustrated, and a gas or plasma output section 110 is simplified for ease of reference. For ease of reference, in the embodiment illustrated in FIG. 1, it should be understood that fluid moves generally from an upstream region at the left of the figure towards a downstream region at the right of the figure.

The gas input manifold 102 may have a gas entry port 112 configured therein. The gas entry port 112 may be configured to introduce a gas into the system 100 according to methods known to those skilled in the art. The gas input manifold 102 may also have a manifold body 114 with means for attachment to the enclosure 108, such as, for example, a flange 116 and a fastener interface 118 such as a bolting means.

Relatedly, the manifold body 114 may be configured to receive an electrode 104 and an end cap 120. In some embodiments, the gas entry port 112 is provided in the manifold body 114, although those skilled in the art will understand the end cap 120 could include a gas entry port 112. Those skilled in the art will also understand that a plurality of gas entry ports 112 may be provided to introduce gas into the system 100 at a number of places, such as on various sides, such as opposing or different sides 116A, 116B of the manifold body 114.

Figure 2:
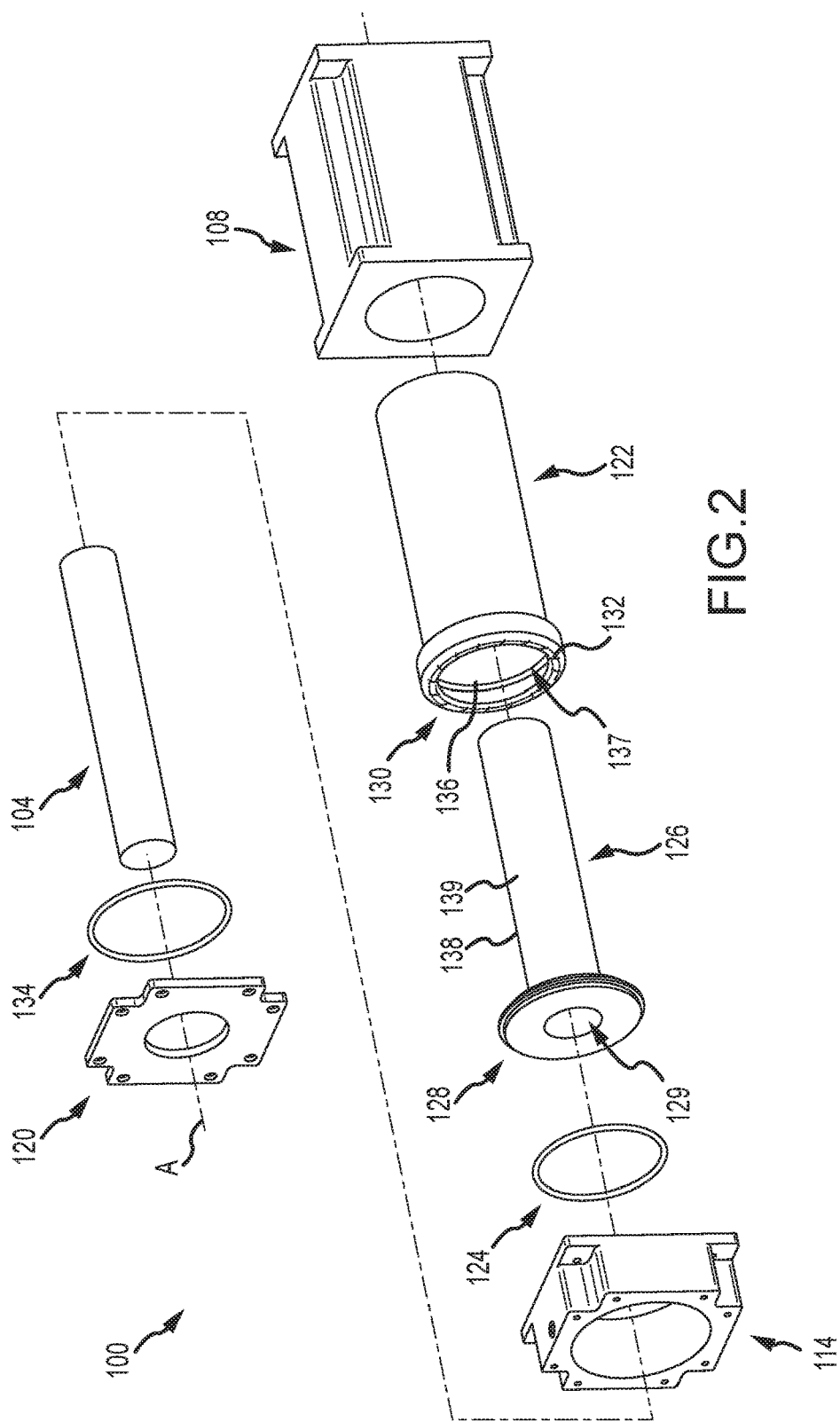
FIG. 2 is an exploded perspective view of the remote plasma source in FIG. 1.

Turning now to FIG. 2, which illustrates an exploded perspective view of the remote plasma source 100, further details thereof are now described. In some embodiments, a housing 111 comprising a manifold body 114 upstream of an enclosure 108. The enclosure 108 may receive an enclosure insulator 122 that is shaped and/or configured to insulate the enclosure 108, which may itself be or comprise an electrode, from plasma inside the remote plasma source 100. In some embodiments, the enclosure insulator 122 is firmly seated in and abuts the enclosure 108, and has a substantially cylindrical inner surface 137 or recess. Those skilled in the art will understand that a seal 124 or a number of seals may be provided to isolate the plasma environment from the ambient atmosphere outside remote plasma source 100.

Continuing simultaneously with FIGS. 1-2, an electrode insulator 126 may be provided and configured to be seated in or partially seated in the enclosure insulator 122 so as to define a space or plasma chamber between the electrode insulator 126 and the enclosure insulator 122. The electrode insulator 126 may also have an inner recess 129 shaped to surround a portion of the inner electrode 104, and the inner recess 129 may be cylindrical and/or firmly seated against the inner electrode 104. A portion of the electrode insulator may be cylindrical with an outer surface 139 and an outer diameter 138 that is less than an inner diameter 136 of the enclosure insulator 122.

Figure 3:
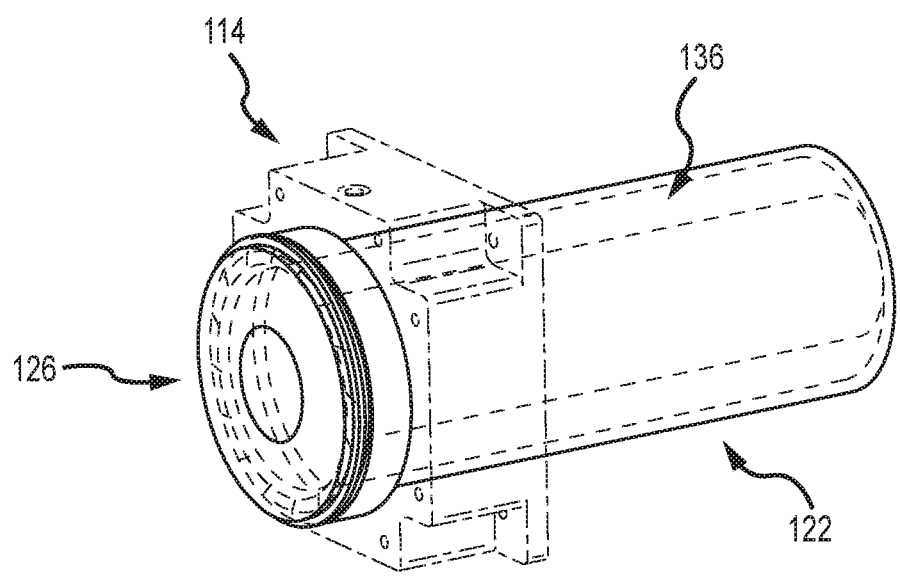
FIG. 3 is a partially transparent perspective view of some components in the remote plasma source in FIG. 1.

In one example, if the insulators 122, 126 are substantially cylindrical, an inner diameter 136 of the enclosure insulator 122 may be greater than an outer diameter 138 of the electrode insulator 126 so as to provide a gap therebetween. This gap forms the plasma chamber 140 (see FIG. 3A). To complete an overview of the remote plasma source 100, an end cap 120 and seal 134 may be provided to assist assembly and positioning of the electrode 104 itself, which extends into and through the manifold body 114 and into the electrode insulator 126. Those skilled in the art will understand that an exposed or proximal end 106A of the electrode 104 may be configured for attachment to a match circuit (not illustrated).

With simultaneous reference to FIGS. 2, 3, 3A and 3B, the electrode insulator 126 may have a generally flanged region 128 configured to abut or seat against a generally flanged region 130 in the enclosure insulator 122. When the insulators 122, 126 and manifold body 114 are assembled together, respective surfaces in these components form a gas chamber 142. This gas chamber 142 may circumscribe the electrode 104 and/or the plasma chamber 140 such that gas received in the gas chamber 142 at one or more gas entry ports 112 is allowed to slow to a reduced velocity to achieve a uniform, fluid pressure around the gas chamber 142, in order to promote an azimuthally uniform distribution of gas into the plasma chamber 140.

With particular reference to FIGS. 3A and 3B, one or both of the electrode insulator 126 or the enclosure insulator 122 may have a plurality of grooves 133 formed therein, such that, when the electrode insulator 126 and the enclosure insulator 122 are assembled together, a plurality of channels 132 are formed therebetween. When the electrode insulator 126, the enclosure insulator 122, and the manifold body 114 are assembled to the enclosure 108, gas can be fed to the plasma chamber 140 between the insulators 122, 126 through the plurality of channels 132.

For example, and as most clearly seen in FIG. 3B, one or more of the channels 132 may have an upstream region 132$a$ in fluid communication with the gas chamber 142 and a downstream region 132$b$ in fluid communication with the plasma chamber 140. One or more of the channels 132 may have a tangential component, as seen most clearly in FIG. 2. In some embodiments, one or more of the channels 132 may have a longitudinal component, as seen most clearly in FIG. 3B. For example, the channels 132 may have an upstream region 132$a$ that is narrower, that is, with a smaller cross-section geometry, than the downstream region 132$b$, so as to provide a longitudinal component to a velocity of gas passing therethough. Likewise, the channels 132 may introduce a tangential component to the velocity of gas passing therethrough. As a result, the channels 132 may introduce a swirling effect on gas passing therethrough, in a manner to be discussed in subsequent sections of this disclosure.

As previously alluded, a proximal or gas input section 102 of the remote plasma source 100 provides gas introduction, and may have one or more gas entry ports 112. The gas chamber 142 and channels 132, taken together, may provide a gas diffusing effect on gas passing therethrough.

Taken together, the manifold body 114, the flanged portion 128 of the electrode insulator 126, and the flanged portion 130 of the enclosure insulator 122, which form channels 132, may provide gas mixing and introduction of feed gas to the plasma chamber 140. In some embodiments, the electrode insulator 126 may be integrated with the manifold body 114 and/or at least a portion of the enclosure insulator 122, and may be ceramic or any suitable material.

That is, generally, the proximal region of the remote plasma source 100 may be referenced as a gas diffuser 144, and those skilled in the art will understand that the components therein may be separated or unitary in manners other than described herein.

In some embodiments, the gas diffuser 144 and/or gas manifold may be integrated with the chamber or enclosure insulator 122, and may be ceramic or made of any suitable material. As illustrated, gas flows from the gas entry port(s) 112 into the manifold body 114, through the channels 132, and into the plasma chamber 140. All surfaces exposed to the plasma may be high density, high purity alumina ceramic or other suitable material.

Continuing with FIGS. 1-3B, uniform gas introduction and mixing is accomplished with the gas diffuser 144, which may be integrated onto the chamber liner or enclosure insulator 122, and may be further be made of a high density, high purity alumina ceramic or other suitable material. The gas diffuser 144 may have one or more gas entry ports 112, depending on the manifold design, in order to promote a balanced introduction of feed gas(es) through the gas diffuser 144 and into the chamber 140.

In order to maximize the density and uniformity of the plasma, it is beneficial to have homogeneous feed gas characteristics, especially within the electric field. In some embodiments, a novel feed gas distribution manifold is provided that is incorporated into the dielectric, insulating walls of the plasma source. The gas chamber 142 in the gas diffuser 144 may have a larger reservoir volume than is known in the prior art, and may further have an array of small channels 132 connecting the plasma source chamber 140 from the upstream gas chamber 142. These channels 132 may promote azimuthal symmetry of the gas within the plasma chamber 140 via pressure-drop regulated mass flow balancing.

Continuing with FIGS. 1-3B, the feed channels 132 may be designed at varying angles relative to the longitudinal axis A so as to prescribe the radial, tangential, and axial component of velocity, and thus tailor the flow field of gas entering the chamber. Depending on the feed gas chemistry and flow rate and fluid pressure, some embodiments may provide increased or maximized tangential velocity and lowered or minimized axial and/or radial velocity of the gas. That is, the ratio of the tangential component to the axial component and/or radial component may be increased or maximized. Increasing the ratio of the tangential velocity component to the axial velocity component allows the gas momentum to diffuse further upstream, that is, more proximal to the diffuser 144 or input section 102, so as to promote a more uniform residence time and velocity through the downstream electric field. Increasing the ratio of the tangential velocity component to the radial velocity component allows further diffusion of the gas momentum prior to reaching the inner electrode insulator 126, reducing the impingement pressure of the gas on the surfaces of the insulator.

Put succinctly, the diffuser 144, the manifold body 114, the channels 132, and/or the input section 102 generally may be configured to impart a swirling effect on gas passing therethrough. This swirling effect minimizes deviation of a residence time of each particle making up the gas from the average residence time of the particles that make up the gas, and it also reduces azimuthal variations in both bulk fluid density and partial pressures of the gas constituents within the electric field. Those skilled in the art will understand that minimizing variations of pressure and density within the plasma chamber reduces hot spots within the plasma chamber 140, and, in turn, provides for a more uniform wear of the insulators 122, 126 and other components in the remote plasma source 100. It is also understood that reducing the variation in residence time for the gas particles leads to a more consistent, optimized, and repeatable plasma.

Figure 4:
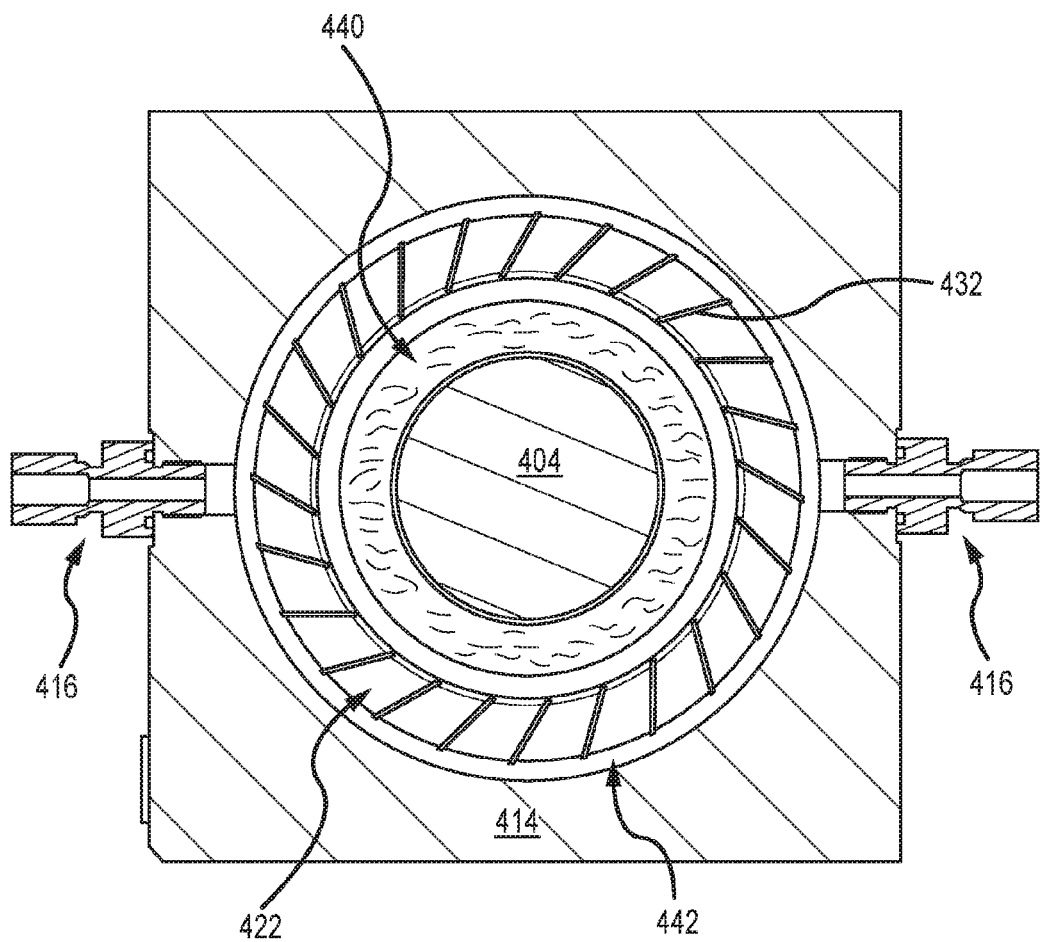
FIG. 4 is a top section view of some features of an exemplary plasma source.

FIG. 4 illustrates a top section view of a remote plasma source 100 according to some embodiments, with some components removed. More specifically, FIG. 4 illustrates how the gas channels 432 may be angled such that the gas is directed towards the center of the plasma chamber 440 and tangent to the electrode 404. As illustrated, the channels 432 are in fluid communication with the gas chamber 442 and the plasma chamber 440, and two gas entry ports 416 in the manifold body 414 provide the process gas.

Figure 5:
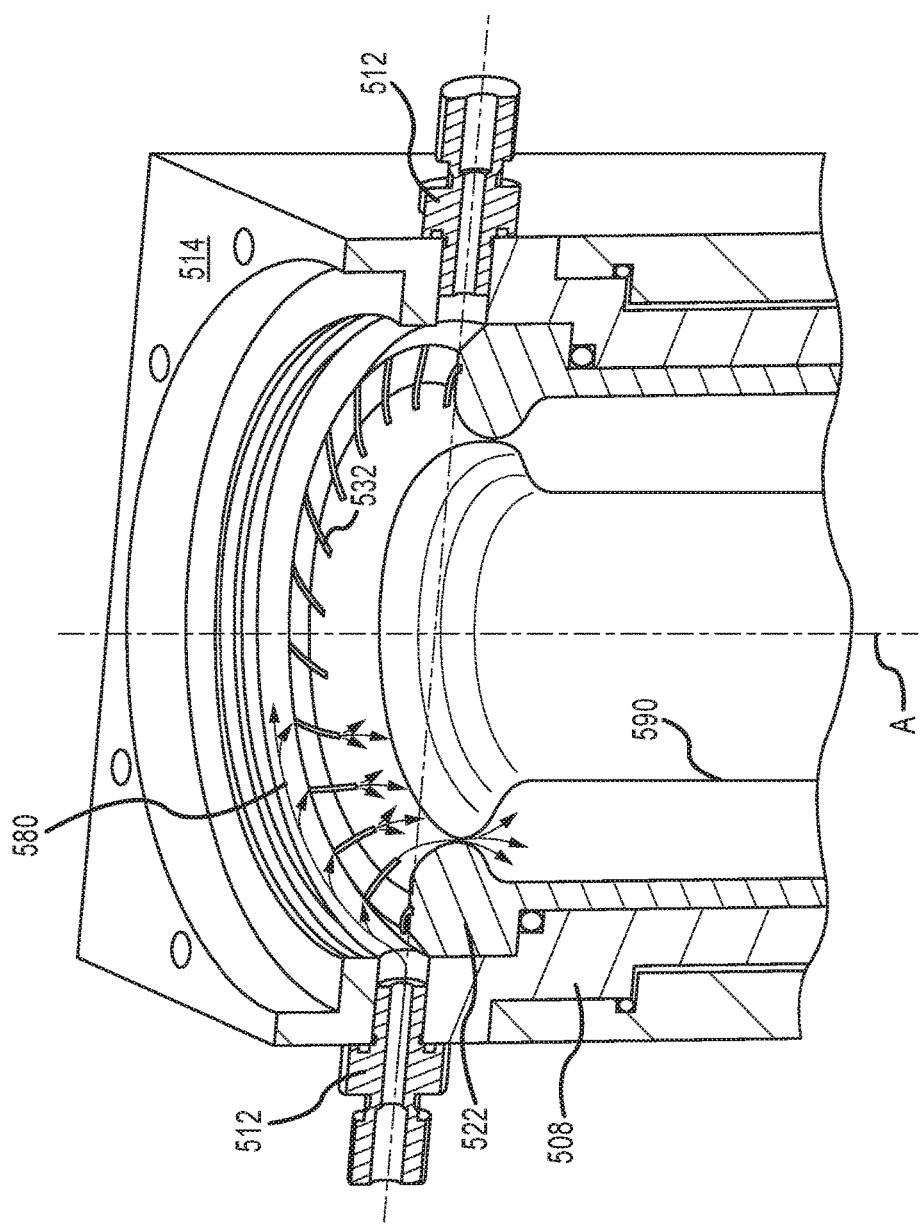
FIG. 5 is a perspective section view of some features of an exemplary plasma source.

FIG. 5 is a perspective section view of some components of a remote plasma source, more specifically, a manifold body 514, gas entry ports 512, and an enclosure insulator 522. FIG. 5 does not illustrate an associated electrode or electrode insulator; however, for clarity, boundary lines 590 are illustrated so as to illustrate how the gas flow 580 is directed in the system. For example, the gas channels 532 may generally have a tangential component and a longitudinal component relative to the longitudinal axis A of the system. The entrance angle of the gas channels 532 may therefore promote a swirling effect yet inhibit hard angle impacts with the walls of the enclosure insulator 522 and the electrode insulator (not illustrated, see boundaries 590). In turn, the particle wall impacts are decreased while still promoting gas mixture and allowing for uniform gas flow.

Figure 6A:
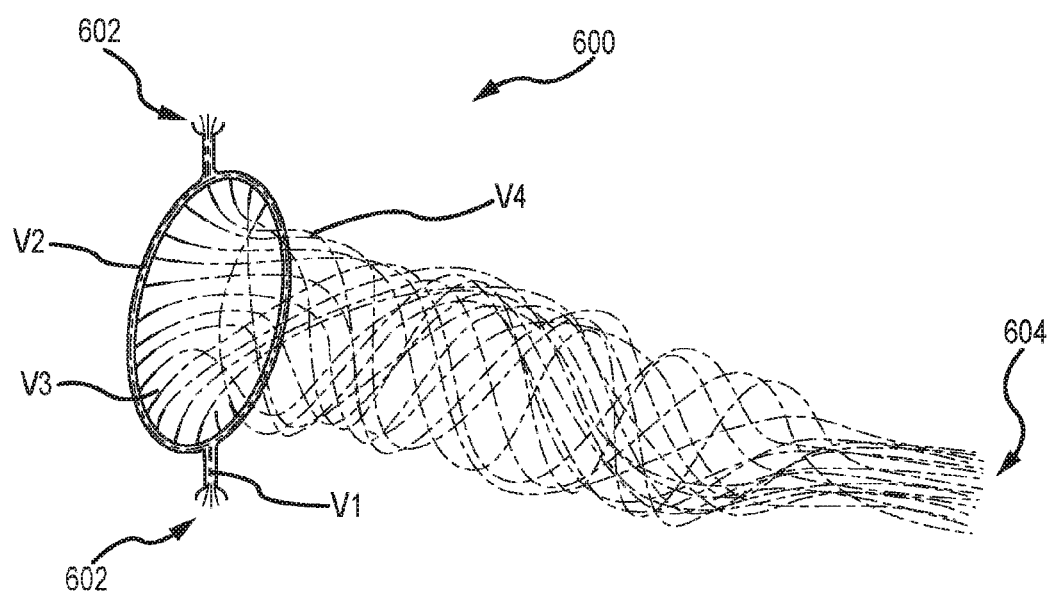
FIG. 6A is a flow model illustrating some fluid characteristics of an exemplary remote plasma source.
Figure 6B:
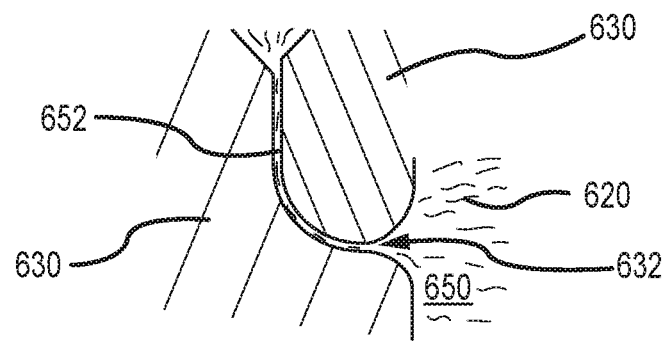
FIG. 6B is a detailed section view of an exemplary plasma chamber entry.
Figure 6C:
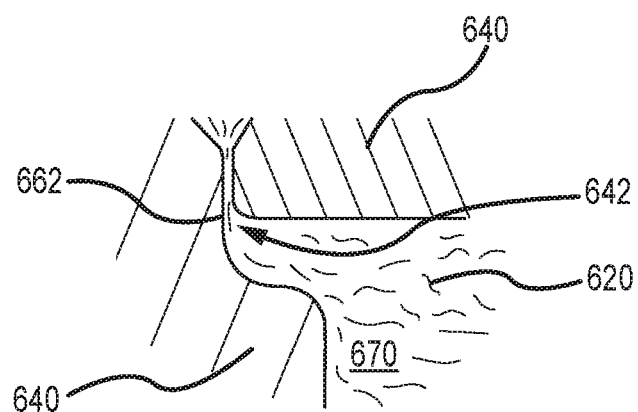
FIG. 6C is a detailed section view of another exemplary plasma chamber entry.

FIGS. 6A-6C illustrate gas flow dynamics of a remote plasma source according to some embodiments. In FIG. 6A, fluid modeling is used to evaluate gas flow velocity and pressure for example from two entry regions 602 (such as, e.g., introduced by two gas entry ports 112 such as those illustrated in FIGS. 1-3B) through a discharge zone 604 in the system or remote plasma source 100. Those skilled in the art will recognize that effective gas introduction may be achieved from a single or a plurality of ports such as the gas entry ports 112 previously described herein, provided the gas chamber 442 and gas channels 432 are properly dimensioned to uniformly introduce the gas feedstock to the plasma chamber 440. As illustrated, some embodiments may provide an improved coaxial plasma system, such as the remote plasma source 100, having a gas system that intentionally guides the ingress gas from a radial flow path to an axial flow path (e.g. imparts a longitudinal velocity), imparts an azimuthal spin for mixing (e.g. imparts a tangential velocity), promotes a more uniform chamber residence time, and having an improved pressure window for ignition and plasma sustenance.

As illustrated in FIG. 6A, gas entering at the entry regions 602, such as through gas entry ports 112, has a first velocity V1, and may have a relatively high velocity. When the gas enters the gas chamber 142, the gas is slowed to a second velocity V2 less than the first velocity V1. In some embodiments, the second velocity is reduced by one or more orders of magnitude compared to the inlet velocity V1. As the gas passes through the channels 132 (see FIG. 2), the gas is accelerated to a third velocity V3 higher than the second velocity V2 and, in some embodiments, higher than the first velocity V1. In some embodiments, this third velocity V3 is designed to approach but not exceed the speed of sound, or around 340 meters per second if the plasma chamber pressure is at around sea-level atmospheric pressure and the feedstock gas is air. As the gas enters the plasma chamber, the gas is allowed to expand and slow to a fourth velocity V4 less than the third velocity V3.

In some embodiments, the first velocity V1 is approximately 60 meters per second or less. In some embodiments, the second velocity V2 is approximately 20 meters per second or less. In some embodiments, the third velocity V3 is approximately 230 meters per second up to approximately 340 meters per second. In some embodiments, the fourth velocity V4 is approximately 35 meters per second or less.

Those skilled in the art will understand that the highest velocity V3 may be achieved at the entrance between the channels 132 and the plasma chamber 140, due to the expansion of the gas at the entrance, and thus there may be some overlap as to where exactly the third velocity V3 may occur. Nonetheless, the third velocity V3 is designed or selected to be sufficient, at high gas flow rates, to provide a choked-flow condition through the channels 132, and thus promote an azimuthally symmetric mass flow into the chamber 140. Specifically, when the gas flow rate is lower and/or chamber pressure is higher than the conditions required to achieve choked flow through the channels 132, then the cross-sectional area of the gas chamber 142 is sized appropriately, relative to the total combined cross-sectional area of the channels 132, to provide a pressure-regulated, azimuthally-symmetric communication of gas between channels 132 and the plasma chamber 140. Put succinctly, some embodiments of apparatuses or methods disclosed herein may include providing a pressure-regulated, and/or azimuthally-symmetric introduction of gas from an upstream region or gas inlet region to a plasma chamber 140; in some embodiments, the pressure-regulated, and/or azimuthally-symmetric introduction may be achieved by choking the flow of the gas by way of a plurality of channels 132 having a cross-section many times smaller than a cross section of a plasma chamber 140.

Turning now to FIGS. 6B-6C, various geometries may be employed to control expansion, and thus velocity, pressure, and density, of the gas as it enters the plasma chamber 140. FIG. 6B illustrates a gas or fluid 620 constrained by solid material 630, which may include a channel 452 as generally described herein (see e.g. channels 132, manifold body 114, insulators 122, 126). In some embodiments, the solid material 630 may include a curved, chamfered, or shelved interface or plasma chamber entry point 632 so as to guide the expansion of the gas in the plasma chamber 650. For example, the entry point 632 may provide for a smooth expansion in low pressure applications, although those skilled in the art will understand that chemistry and flow rate of the gas will also affect the expansion and potentially the particular shape of the plasma chamber entry point 632.

As illustrated in FIG. 6C, which likewise illustrates a solid material 640 constraining a fluid 620, in some embodiments, the channels 662 (e.g. channels 132, insulators 122, 126, manifold body 114) may be shaped to provide a more abrupt entry point 642 into the plasma chamber 670. For example, solid material 640 used in systems having higher pressure applications, a relatively abrupt entry point 642 into a plasma chamber 140 may be suitable to effectuate expansion and mixing of the gas, although the chemistry and flow rate of the gas may affect the particular geometry that is selected.

In some embodiments, the average residence time of the particles passing through the plasma chamber 140, 650, 670 is determined by the flow rates, chamber volume, and gas pressure, and may be about 60 milliseconds, a time period that is short enough to swiftly advect significant radicals beyond the electromagnetic field and primary plasma chamber 140, 650, 670 and into another chamber (not illustrated), while sufficiently long enough to allow ionization, such as through inelastic electron scattering collisions within the electric field of the plasma chamber 140.

In some embodiments, the remote plasma source is a capacitively coupled coaxial design, with concentric, cylindrical electrodes separated by a radial gap which comprises the plasma chamber. The electric field in some embodiments of the coaxial system is dominantly radial, and may reach 500 V/cm. To avoid arcing, the dimensions of the near-radial feed channels may be modified, depending on feed gas and electric field characteristics, to promote a sufficiently high pressure (via increased velocity, or dynamic pressure) in the feed channels. The high pressure limits breakdown inside the tubes to be above the paschen curve. Thus, plasma breakdown is limited to the chamber entry point. At the exit point, the gas is extremely high velocity, near sonic, limiting how long neutrals can reside in a critical position to do damage or breakdown. At the high velocity point, even plasmas will tend to flow with the neutrals, due to electron neutral collisionality (>MHz at pressures around 1 torr)—thereby not allowing secondary breakdown methods such as multipactor to be established. Thus the combination of narrow channel plus an expansion zone free of secondary breakdown allows the non-breakdown in the ceramic to have the extensive pressure range.

A second parallel constraint in this arrangement may be to have mixing of gas after it exits the small conductance tubes. Of course straight expansion into a low pressure zone will execute some mixing. To supplement that, an azimuthal spin is imparted to the flow, and the resulting azimuthal spin in the chamber produces mixing within the chamber.

A third parallel constraint may be to have azimuthal uniformity to the flow. This may be achieved by standard orifice to manifold requirements for uniform flow.

The embodiments described herein may provide a broader range of gas chemistry and plasma ignition and operating windows than is available in traditional plasma sources. The embodiments described herein may also provide a wider scope of possible applications as compared to existing remote plasma source designs, such as direct processing (e.g. etching, deposition).

Figure 7:
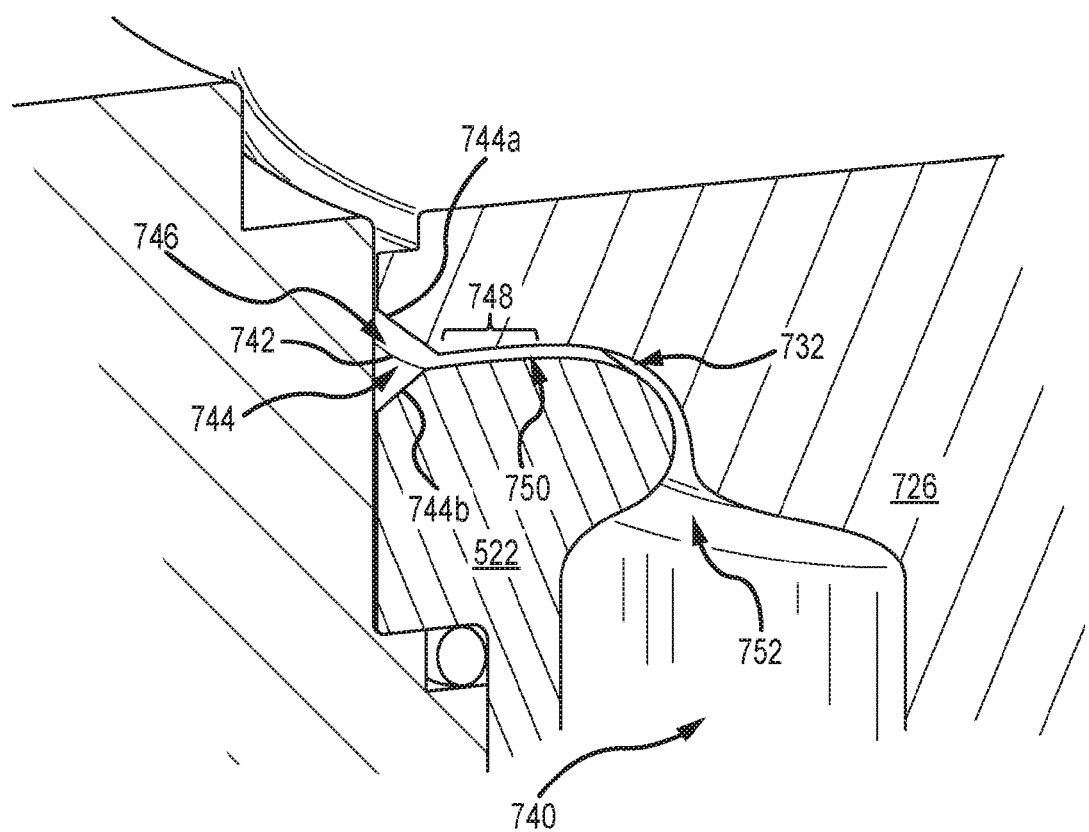
FIG. 7 is a perspective section view of an exemplary channel and plasma chamber entry.

FIG. 7 illustrates an exemplary entrance to a plasma chamber 740. For example, a channel 732 formed by the electrode insulator 726 and the enclosure insulator 522 is in fluid communication with the gas chamber 742 and the plasma chamber 740. In some embodiments, an angle, chamfer, curvature, or offset surfaces 746A, 746B at the entrance 744 to the channel 732 may be provided, thus providing an enlarged or relieved entry port 746 into the channel 732, which reduces fluid pressure losses. The area and geometry of the channel 732 itself may also be sized to promote flow. For example, a triangle shape (not illustrated), such as at a constricted section 750 may allow guidance of particles through the channel 732, and the area or constricted section 750 may be tuned to the gas flow of the system. Those skilled in the art will understand that a triangular constricted section 750 may be machined or formed in the enclosure insulator 522 or the electrode insulator 726, such as pre- or post-firing, or by other means and methods known to those skilled in the art.

Continuing with FIG. 7, in some embodiments, material may be removed from the gas ring or gas chamber 742, thus removing an area of high thermal expansion and/or friction. Some embodiments of the channel 732 may have a reduced contact pad 748 between the two ceramic parts making up the insulators 522, 726, thus reducing contaminate particles at the joints. That is, portions of the insulators 522, 726 that abut one another can be minimized in some embodiments. Further, the length of the gas channel(s) 732, 132 relative to the contact pad 748 may be improved by angular location of the channel(s) 732, 132. A longer channel 732, 132 may allow for improved directional flow and resistance to plasma arcing. Channel(s) 732, 132 perpendicular to the electrical field may help resist plasma arcing. A channel(s) 732, 132 at an angle to a preferred flow zone may be provided, so as to introduce a swirling effect with longitudinal launch.

Continuing still with FIG. 7, a squeezed entry or the constricted region 750 of a channel may create a high velocity (fan shaped) boundary between channel 732 and plasma or the plasma chamber 740, and reduce arcing. An ever increasing width may promote a controlled expansion, as well as may direct expansion. An ever changing angular geometry relative to the electric field may reduce dead zones for arcing to occur. Placing an entrance 752, which may be a relieved plasma chamber entrance 752, to the plasma chamber 740 that is far from the conductors at the entry geometry may also reduce the opportunity for particles to enter from the opposite direction (e.g. reduces back flow).

The entrance 752 to the plasma chamber 740, as illustrated, may be abrupt yet still controlled.

Figure 8:
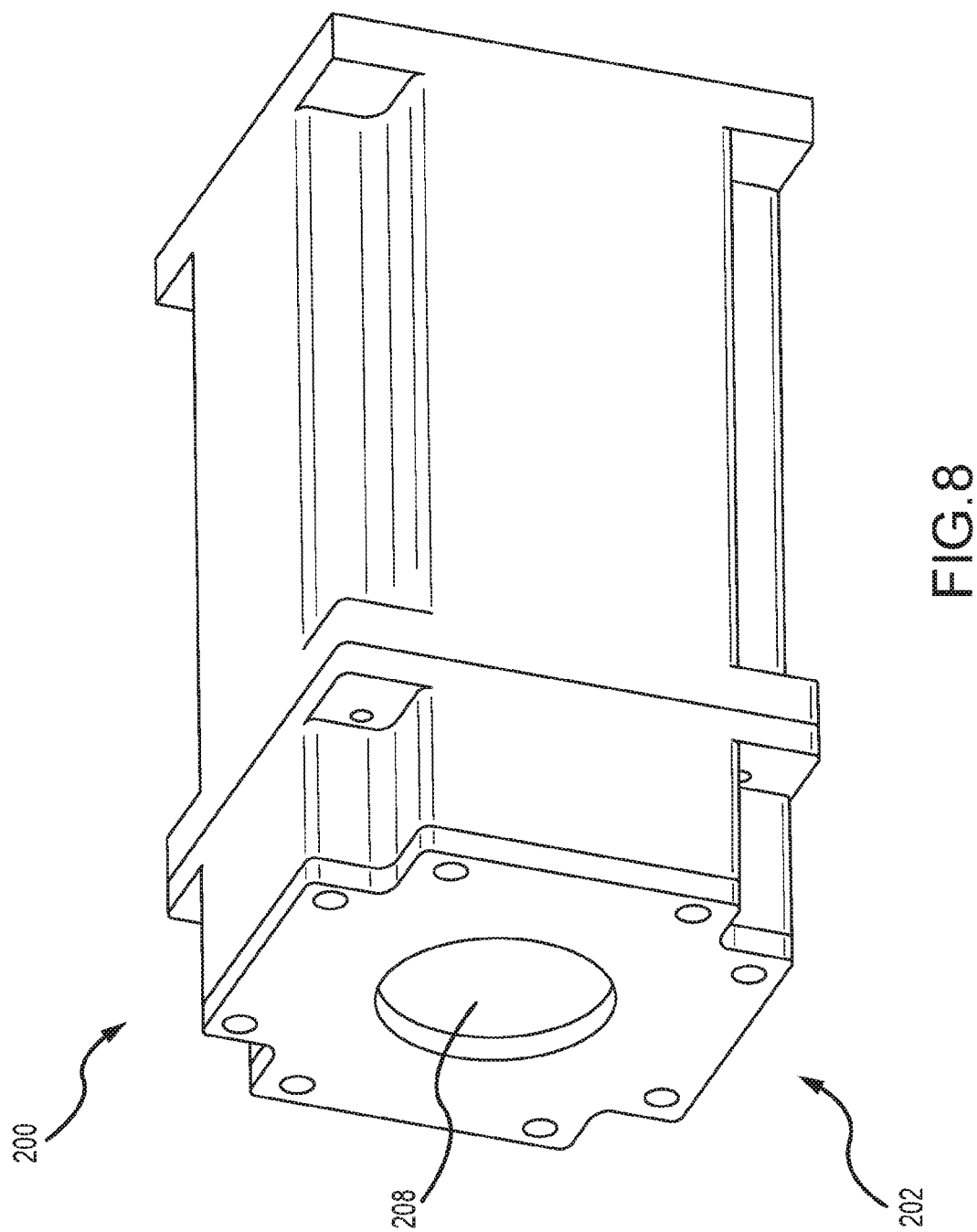
FIG. 8 is a flowchart of an exemplary method.
Figure 8B:
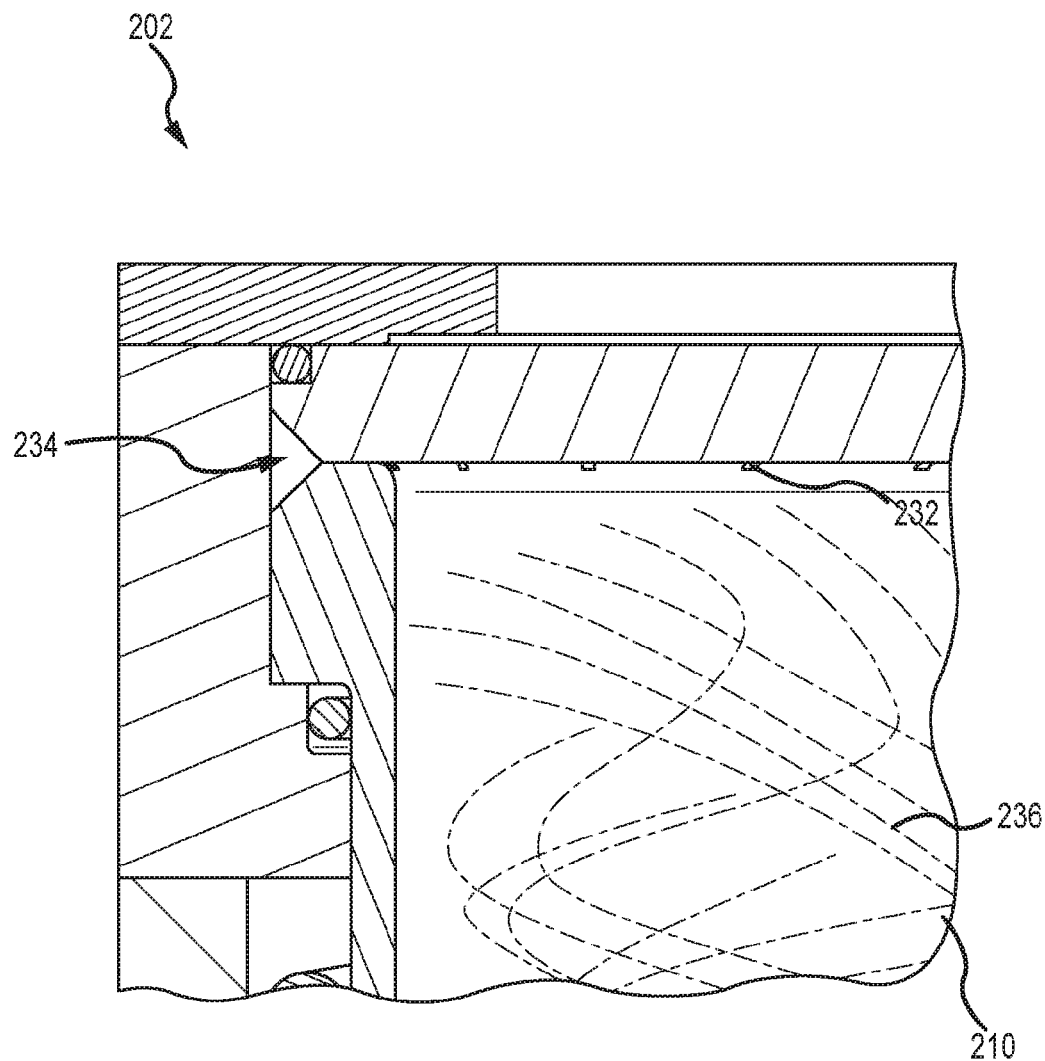
FIG. 8B is a detailed section view of an exemplary 202.
Figure 8C:
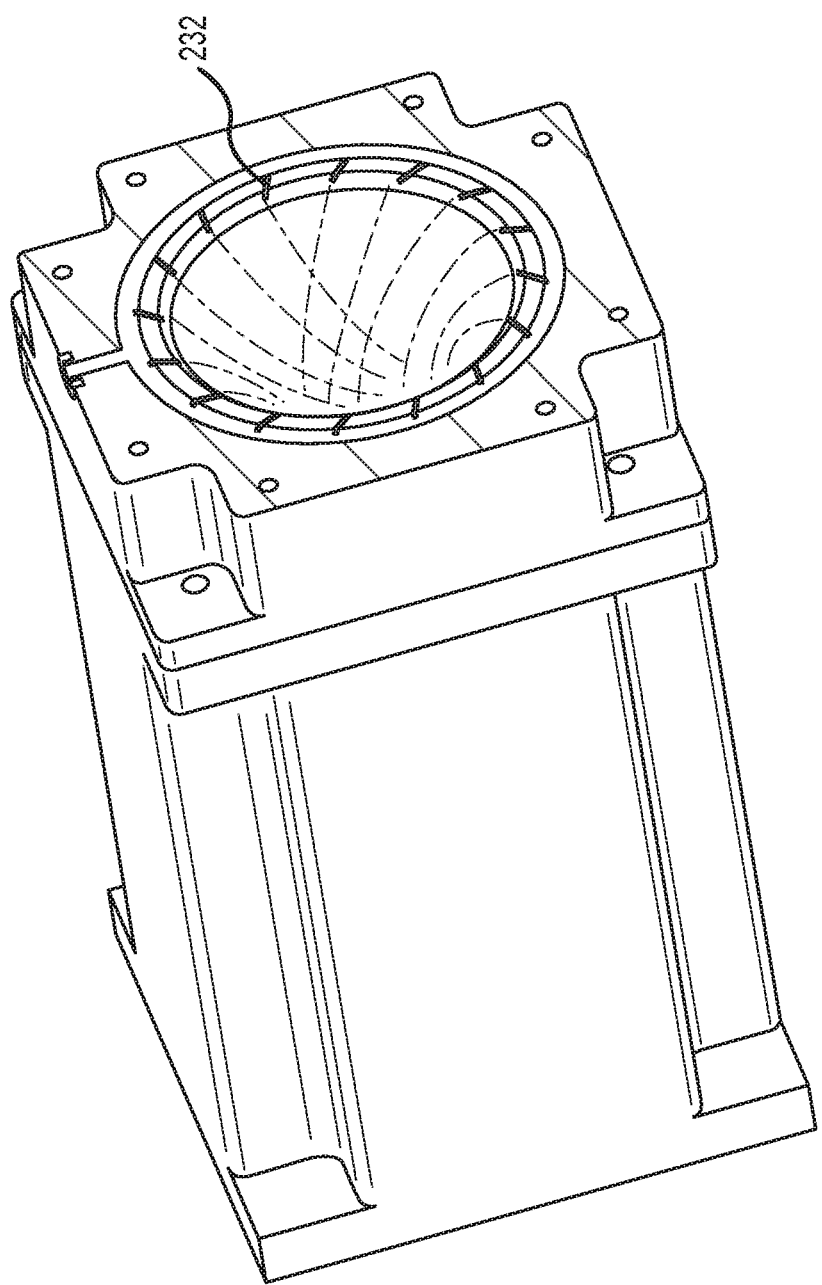
FIG. 8C is a perspective view illustrating exemplary flow characteristics.

In some embodiments, the remote plasma source 200 is an inductively coupled cylindrical design, as depicted in FIGS. 8-8C. That is, the remote plasma source 200 may have a gas input manifold 202 is comprised of the chamber enclosure 204 or the enclosure insulator 214 and an upstream gas inlet section 206 that provides a lid or cap 208 on the plasma chamber 210, sealing the plasma chamber 210 from the ambient atmosphere and comprising part of the gas input manifold 202. In an inductively coupled remote plasma source 200, time-varying electric current runs through a coil 212 about or outside of the plasma chamber 210. The electric current in the coil 212 induces time-varying magnetic fields inside the plasma chamber 210, thereby exciting electrons and ionizing the feedstock gas. In some embodiments, the external electric coil 212 is cylindrical, wrapping around the cylindrical chamber enclosure 204 or enclosure insulator 214. In some embodiments, the electric coil 212 is planar, mounted on a flat face of the chamber enclosure 204 or gas input section 202.

As illustrated most clearly in FIG. 8B, an inductively coupled remote plasma source 200 may have a plurality of channels 232 and a gas chamber 234 substantially as previously described herein with reference to FIGS. 1-7. That is, a swirling effect may be imparted the gas 236 substantially as previously described herein, even where the gas chamber 234 is not formed between a central electrode insulator and an enclosure insulator.

Figure 9:
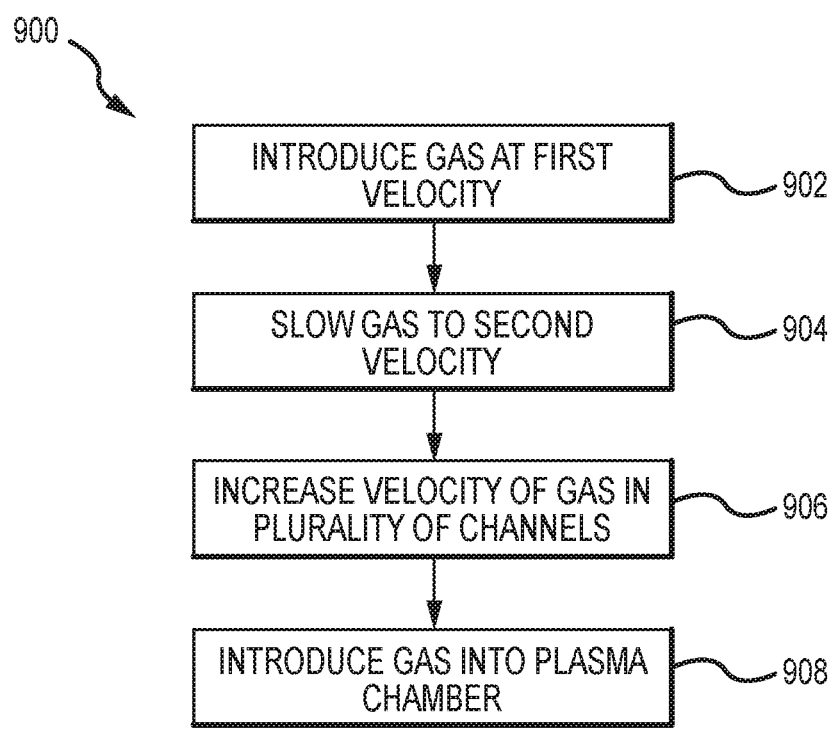
FIG. 9 is a flowchart of another exemplary method.

Turning now to FIG. 9, a method 900 of feeding gas to a remote plasma source is now described in detail. The method 900 includes introducing 902 a process gas to a manifold at a first velocity, such as a relatively high velocity; slowing 904 the process down to a second velocity less than the first velocity; feeding 906 the gas into a plurality of diffusing channels and increasing the velocity of the gas to a third velocity; and introducing 908 the gas into a plasma chamber.

Introducing 902 the gas at the first velocity may include introducing a gas having a velocity of approximately 60 meters per second or less. Slowing 904 the gas to a second velocity may include slowing the gas to a velocity of 20 meters per second or less, or 10 meters per second or less. Increasing 906 the velocity of the gas may include increasing the velocity of the gas to a third velocity.

Introducing 908 the gas into the plasma chamber may include introducing the gas at a velocity of about 340 meters per second or less, allowing the gas to expand, and allowing the gas to slow to a velocity of about 35 meters per second or less. The method may be achieved using any of the embodiments previously described herein with reference to FIGS. 1-8C.

Figure 10:
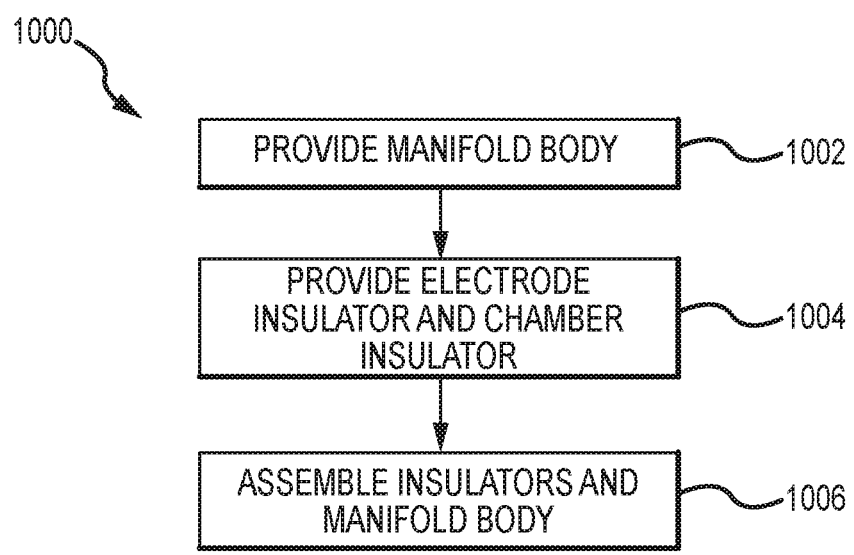
FIG. 10 is a flowchart of another exemplary method.

Turning now to FIG. 10, a method 1000 of making a gas input manifold for a remote plasma source is now described. The method 1000 includes providing 1002 a manifold body, providing 1004 an electrode insulator and an enclosure or chamber insulator, and assembling 1006 the insulators and manifold body.

Providing 1002 a manifold body includes providing a manifold body shaped with a gas entry port configured to couple to a gas supply, the manifold body configured to couple to an enclosure defining a plasma chamber.

Providing 1004 an electrode insulator and a chamber insulator includes providing an electrode insulator shaped to surround an electrode and providing a chamber insulator shaped to surround a portion of the electrode insulator, wherein at least one of the electrode insulator or the chamber insulator has a plurality of recesses therein.

Assembling 1006 includes assembling the electrode insulator, the chamber insulator, and the manifold body to define a gas chamber and a plurality of channels therebetween, the plurality of channels shaped and positioned to direct the gas from the gas chamber downstream and to impart a longitudinal velocity and a tangential velocity on the gas as the gas passes through the plurality of channels, and whereby the gas input manifold is configured to impart a swirling effect on the gas exiting the plurality channels as the gas moves downstream.

The method 1000 may be achieved by making, producing or assembling a remote plasma source 100, 200 or gas input manifold 102 as previously described herein with reference to FIGS. 1-8C.

Various embodiments of the invention are disclosed herein, as listed below.

Embodiment 1

A remote plasma source configured to transform a gas passing therethrough into a plasma, the remote plasma source comprising: an enclosure defining a plasma chamber, the enclosure configured to isolate the gas from external atmosphere, as the gas is transformed into the plasma and comprising an output passage configured to deliver constituents of the plasma from the plasma chamber; and a gas input manifold coupled to the enclosure and configured to introduce the gas into the plasma chamber; wherein a longitudinal axis extends through the gas input manifold and through the plasma chamber; the gas input manifold comprises a gas entry port in a manifold body, a gas chamber, and a plurality of channels, the gas entry port configured to couple to a gas supply and to introduce the gas to the gas chamber, the plurality of channels configured to direct the gas from the gas chamber downstream to the plasma chamber and to impart a radial velocity and a longitudinal velocity on the gas as the gas passes through the plurality of channels.

Embodiment 2

The remote plasma source of embodiment 1, wherein: the plurality of channels are configured to direct the gas from the gas chamber downstream to the plasma chamber and to impart a tangential velocity on the gas as the gas passes through the plurality of channels.

Embodiment 3

The remote plasma source of embodiment 1, wherein: the gas input manifold is configured to impart a swirling effect on the gas exiting the plurality channels as the gas moves downstream towards the output region.

Embodiment 4

The remote plasma source of embodiment 1, further comprising: an electrode extending into the plasma chamber and configured to couple to a match circuit; wherein the gas input manifold comprises an electrode insulator body configured to insulate the electrode from the plasma chamber and an enclosure insulator body configured to insulate the enclosure from the plasma chamber, the enclosure insulator body further configured to abut the electrode insulator body; and the plurality of channels are defined by recesses placed in one or both of the electrode insulator body or the enclosure insulator body.

Embodiment 5

The remote plasma source of embodiment 4, wherein: the gas chamber is defined by respective surfaces on the electrode insulator body, the enclosure insulator body, and the manifold body.

Embodiment 6

The remote plasma source of embodiment 1, wherein: the gas entry port is configured to impart a first velocity to the gas; the gas chamber is configured to slow the gas to a second velocity less than the first velocity; and the plurality of channels are configured to impart a third velocity to the gas, the third velocity greater than the second velocity.

Embodiment 7

The remote plasma source of embodiment 1, wherein: the plurality of channels are configured to introduce a gas comprising a plurality of particles, each of the plurality of particles having a chamber residence time in the plasma chamber; and the remote plasma source is configured to inhibit deviation of the chamber residence time of the each of the plurality of articles from an average residence time of the plurality of particles.

Embodiment 8

The remote plasma source of embodiment 1, wherein: at least one of the plurality of channels has a length and a cross-sectional area selected maintain positive pressure relative to at least one of the plasma chamber or a Paschen breakdown pressure; whereby the at least one of the plurality of channels at least one of: maintains a downstream flow of the gas, or prevents discharge of the gas within the gas input manifold.

Embodiment 9

The remote plasma source of embodiment 1, wherein: at least one of the plurality of channels has a length and a cross-sectional geometry selected to inhibit arcing and plasma development within the gas channels; the cross-sectional area of the at least one of the plurality of channels is configured to impart a first pressure on gas in the at least one of the plurality of channels; and the plasma chamber is configured to impart a second pressure on gas in the plasma chamber; wherein the first pressure is greater than the second pressure relative to the plasma chamber.

Embodiment 10

The remote plasma source of embodiment 9, wherein: the cross-sectional geometry of the at least one of the plurality of channels varies from an upstream region having a first cross-sectional area to a downstream region having a second cross-sectional area that is greater than the first cross-sectional area.

Embodiment 11

The remote plasma source of embodiment 9, wherein at least one of: the length and the cross-sectional geometry are selected to impart a reduced propensity for plasma formation in the at least one of the plurality of channels; or the at least one of the plurality of channels comprises a relieved entry port and a relieved plasma chamber entrance, whereby the at least one of the plurality of channels is configured to mitigate local electric field concentration.

Embodiment 12

The remote plasma source of embodiment 1, further comprising: a plurality of electrodes configured to impart an electrical field in the plasma chamber; and at least one of the plurality of channels is configured to introduce gas into the plasma chamber such that the gas moves in a direction that is substantially perpendicular to the electrical field when plasma is in the plasma chamber.

Embodiment 13

The remote plasma source of embodiment 1, wherein: at least one of the plurality of channels comprises a first region having a first cross-sectional area, and a second region having a cross-sectional area that continuously increases from the first cross-sectional area to a second cross-sectional area, the second region further having a continuously changing angle relative to the longitudinal axis.

Embodiment 14

A gas input manifold for a remote plasma source, wherein: the gas input manifold is configured to couple to an enclosure defining a plasma chamber and to introduce the gas into the plasma chamber; a longitudinal axis extends through the gas input manifold; the gas input manifold comprises a gas entry port in a manifold body, a gas chamber, and a plurality of channels; the gas entry port is configured to couple to a gas supply and to introduce the gas to the gas chamber; and the plurality of channels are configured to direct the gas from the gas chamber downstream and to impart a radial velocity and a longitudinal velocity on the gas as the gas passes through the plurality of channels.

Embodiment 15

The gas input manifold of embodiment 14, wherein: the plurality of channels are configured to impart a tangential velocity on the gas as the gas passes through the plurality of channels.

Embodiment 16

The gas input manifold of embodiment 14, wherein: the gas input manifold is configured to impart a swirling effect on the gas exiting the plurality channels as the gas moves downstream.

Embodiment 17

The gas input manifold of embodiment 14, wherein: the gas input manifold comprises an electrode insulator body configured to surround an electrode, and an enclosure insulator body configured to couple to the enclosure; the enclosure insulator body is further configured to abut the electrode insulator body; and the plurality of channels are defined by recesses placed in at least one of the electrode insulator body or the enclosure insulator body.

Embodiment 18

The gas input manifold of embodiment 17, wherein: the gas chamber is defined by respective surfaces on the electrode insulator body, the enclosure insulator body, and the manifold body.

Embodiment 19

The gas input manifold of embodiment 14, wherein: the gas chamber is one of: defined by respective surfaces on an electrode body, the enclosure, and the manifold body; or formed in one of the electrode body, the enclosure, an electrode insulator body, or the manifold body.

Embodiment 20

The gas input manifold of embodiment 14, wherein: the gas entry port is configured to impart a first velocity to the gas; the gas chamber is configured to slow the gas to a second velocity less than the first velocity; and the plurality of channels are configured to impart a third velocity to the gas, the third velocity greater than the second velocity.

Embodiment 21

The gas input manifold of embodiment 14, wherein: the plurality of channels are configured to introduce a gas comprising a plurality of particles; and the swirling effect is configured to inhibit deviation of a plasma chamber residence time of the each of the plurality of articles from an average residence time of the plurality of particles.

Embodiment 22

The gas input manifold of embodiment 14, wherein: at least one of the plurality of channels has a length and a cross-sectional area selected maintain positive pressure relative to at least one of the plasma chamber or a Paschen breakdown pressure; whereby the at least one of the plurality of channels at least one of: maintains a downstream flow of the gas, or prevents discharge of the gas within the gas input manifold.

Embodiment 23

The gas input manifold of embodiment 22, wherein: at least one of the plurality of channels has a length and a cross-sectional geometry selected to inhibit arcing and plasma development within the gas channels; the cross-sectional area of the at least one of the plurality of channels is configured to impart a first pressure on gas in the at least one of the plurality of channels; and the plasma chamber is configured to impart a second pressure on gas in the plasma chamber; wherein the first pressure is greater than the second pressure relative to the plasma chamber.

Embodiment 24

The gas input manifold of embodiment 22, wherein: the length and the cross-sectional geometry are selected to impart a reduced propensity for plasma formation in the at least one of the plurality of channels; or the at least one of the plurality of channels comprises a relieved entry port and a relieved plasma chamber entrance, whereby the at least one of the plurality of channels is configured to mitigate local electric field concentration.

Embodiment 25

The gas input manifold of embodiment 14, wherein: at least one of the plurality of channels comprises a first region having a first cross-sectional area, and a second region having a cross-sectional area that continuously increases from the first cross-sectional area to a second cross-sectional area.

Embodiment 26

A method of making a gas input manifold for a remote plasma source, comprising: providing a manifold body shaped with a gas entry port configured to couple to a gas supply, the manifold body configured to couple to an enclosure defining a plasma chamber; providing an electrode insulator shaped to surround an electrode and a chamber insulator shaped to surround a portion of the electrode insulator, wherein at least one of the electrode insulator or the chamber insulator has a plurality of recesses therein; assembling the electrode insulator, the chamber insulator, and the manifold body to define a gas chamber and a plurality of channels therebetween, the plurality of channels shaped and positioned to direct the gas from the gas chamber downstream and to impart a longitudinal velocity and a tangential velocity on the gas as the gas passes through the plurality of channels, and whereby the gas input manifold is configured to impart a swirling effect on the gas exiting the plurality channels as the gas moves downstream.

Embodiment 27

The method of embodiment 25, further comprising: configuring the gas entry port to impart a first velocity to the gas; configuring the gas chamber to slow the gas to a second velocity less than the first velocity; and configuring the plurality of channels to impart a third velocity to the gas, the third velocity greater than the second velocity.

Embodiment 28

The method of embodiment 25, comprising at least one of: forming at least one of the plurality of channels to have a length and a cross-sectional geometry, wherein the length and the cross-sectional geometry are selected to impart a reduced propensity for plasma formation in the at least one of the plurality of channels; or providing the at least one of the plurality of channels with a relieved entry port and a relieved plasma chamber entrance, whereby the at least one of the plurality of channels is configured to mitigate local electric field concentration.

Embodiment 29

The method of embodiment 28, wherein: providing the cross-sectional geometry of the at least one of the plurality of channels comprises providing a cross-sectional geometry that varies from an upstream region having a first cross-sectional area to a downstream region having a second cross-sectional area that is greater than the first cross-sectional area.

Embodiment 30

The method of embodiment 29, wherein: forming the at least one of the plurality of channels comprises forming the cross-sectional geometry of the at least one of the plurality of channels with a first region having a first cross-sectional area, and a second region having a cross-sectional area that continuously increases from the first cross-sectional area to a second cross-sectional area.

Embodiment 31

A remote plasma source, comprising: a plasma chamber; a gas input manifold; an output region; means for introducing a gas into the plasma chamber, said means for introducing configured to impart a radial velocity and a longitudinal velocity on the gas, relative to a longitudinal axis through the remote plasma source.

Embodiment 32

A remote plasma source, comprising: a gas input section for receiving a process gas; a plasma region downstream of the gas input section, for transforming the process gas into a plasma; an output section downstream of the plasma region, for releasing constituents of plasma formed by the plasma region; a housing comprising an enclosure and a manifold body upstream of the enclosure, the manifold body having a gas entry port for receiving a process gas; a cylindrical inner electrode having a length along a longitudinal axis and extending from the gas input section towards the plasma region; an electrode insulator having a cylindrical recess for receiving the inner electrode and an outer profile having a flanged region upstream of a cylindrical outer surface; an enclosure insulator disposed about the cylindrical outer surface of the inner electrode to form a plasma chamber between the outer surface of the inner electrode and an inner surface of the enclosure insulator, the enclosure insulator further having a flanged region positioned against the flanged region of the electrode insulator; wherein at least one of the flanged region of the electrode insulator or the flanged region of the enclosure insulator comprises a plurality of grooves therein, whereby a plurality of channels is formed between the flanged region of the electrode insulator and the flanged region of the enclosure insulator; a portion of the manifold body is disposed about the flanged regions of the electrode insulator and the enclosure insulator, whereby a gas chamber is formed between the manifold body, the electrode insulator, and the enclosure insulator; the plurality of gas channels are in fluid communication with the gas chamber and the plasma chamber; and wherein the plurality of channels extend radially, longitudinally and tangentially relative to the longitudinal axis, whereby the plurality of channels are configured to impart a radial velocity and a longitudinal velocity on the gas as the gas is fed towards the plasma chamber.

Embodiment 33

A remote plasma source, comprising: a gas input section for receiving a process gas; a plasma region downstream of the gas input section, for transforming the process gas into a plasma; an output section downstream of the plasma region, for releasing constituents of plasma formed by the plasma region; a housing comprising an enclosure and a manifold body upstream of the enclosure, the manifold body having a gas entry port for receiving a process gas; an enclosure insulator or an insulated enclosure defining a plasma chamber within, the enclosure insulator or the insulated enclosure further having a flanged region positioned against the gas input section; wherein at least one of the flanged region or the gas input section comprises a plurality of grooves therein, whereby a plurality of channels is formed between mating faces of the gas input section and the flanged region; at least a portion of the manifold body is disposed about the gas input section and the enclosure insulator or the insulated enclosure, whereby a gas chamber is formed between the manifold body, the gas input section, and the enclosure insulator or the insulated enclosure; the plurality of gas channels are in fluid communication with the gas chamber and the plasma chamber; and wherein the plurality of channels extend radially, longitudinally and tangentially relative to the longitudinal axis, whereby the plurality of channels are configured to impart at least one of a radial velocity, a longitudinal velocity, or a tangential velocity on the gas as the gas is fed towards the plasma chamber.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

Each of the various elements disclosed herein may be achieved in a variety of manners. This disclosure should be understood to encompass each such variation, be it a variation of an embodiment of any apparatus embodiment, a method or process embodiment, or even merely a variation of any element of these. Particularly, it should be understood that the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled.

As but one example, it should be understood that all action may be expressed as a means for taking that action or as an element which causes that action. Similarly, each physical element disclosed should be understood to encompass a disclosure of the action which that physical element facilitates. Regarding this last aspect, by way of example only, the disclosure of a gas entry port should be understood to encompass disclosure of the act of entering or introducing gas—whether explicitly discussed or not—and, conversely, were there only disclosure of the act of constricting, such a disclosure should be understood to encompass disclosure of a "constrictive mechanism". Such changes and alternative terms are to be understood to be explicitly included in the description.

The previous description of the disclosed embodiments and examples is provided to enable any person skilled in the art to make or use the present invention as defined by the claims. Thus, the present invention is not intended to be limited to the examples disclosed herein. Various modifications to these embodiments will be readily apparent to those skilled in the art, and the generic principles defined herein may be applied to other embodiments without departing from the spirit or scope of the invention as claimed.

What is claimed is:

1. A remote plasma source configured to transform a gas passing therethrough into a plasma, the remote plasma source comprising:
   an enclosure defining a plasma chamber, the enclosure configured to isolate the gas from external atmosphere as the gas is transformed into the plasma, and comprising an output passage configured to deliver constituents of the plasma from the plasma chamber; and
   a gas input manifold coupled to the enclosure and configured to introduce the gas into the plasma chamber; wherein
   a longitudinal axis extends through the gas input manifold and through the plasma chamber;
   the gas input manifold comprises a gas entry port in a manifold body, a gas chamber, and a plurality of channels, the gas entry port configured to couple to a gas supply and to introduce the gas to the gas chamber, the plurality of channels configured to direct the gas from the gas chamber downstream to the plasma chamber and to impart a radial velocity on the gas as the gas passes through the plurality of channels;
   wherein at least one of the plurality of channels has a length and a cross-sectional area selected to maintain positive pressure relative to at least one of the plasma chamber or a Paschen breakdown pressure; and
   wherein the at least one of the plurality of channels at least one of: maintains a downstream flow of the gas, or prevents discharge of the gas back into the gas input manifold.

2. The remote plasma source of claim 1, wherein:
   the plurality of channels are configured to direct the gas from the gas chamber downstream to the plasma chamber and to impart a tangential velocity that is tangential to the radial velocity on the gas as the gas passes through the plurality of channels.

3. The remote plasma source of claim 1, wherein:
   the gas input manifold is configured to impart a swirling effect on the gas exiting the plurality channels as the gas moves downstream towards the output passage.

4. The remote plasma source of claim 1, further comprising:
   an electrode extending into the plasma chamber and configured to couple to a match circuit; wherein
   the gas input manifold comprises an electrode insulator body configured to insulate the electrode from the plasma chamber and an enclosure insulator body configured to insulate the enclosure from the plasma chamber, the enclosure insulator body further configured to abut the electrode insulator body; and
   the plurality of channels are defined by recesses placed in one or both of the electrode insulator body or the enclosure insulator body.

5. The remote plasma source of claim 4, wherein:
   the gas chamber is defined by respective surfaces on the electrode insulator body, the enclosure insulator body, and the manifold body.

6. The remote plasma source of claim 1, wherein:
the gas entry port is configured to impart a first velocity to the gas;
the gas chamber is configured to slow the gas to a second velocity less than the first velocity; and
the plurality of channels are configured to impart a third velocity to the gas, the third velocity greater than the second velocity.

7. The remote plasma source of claim 1, wherein:
the plurality of channels are configured to introduce the gas comprising a plurality of particles, each of the plurality of particles having a chamber residence time in the plasma chamber; and
the remote plasma source is configured to inhibit deviation of the chamber residence time of the each of the plurality of particles from an average residence time of the plurality of particles.

8. The remote plasma source of claim 1, further comprising:
a plurality of electrodes configured to impart an electrical field in the plasma chamber; and
at least one of the plurality of channels is configured to introduce the gas into the plasma chamber such that the gas moves in a direction that is perpendicular to the electrical field when plasma is in the plasma chamber.

9. A remote plasma source configured to transform a gas passing therethrough into a plasma, the remote plasma source comprising:
an enclosure defining a plasma chamber, the enclosure configured to isolate the gas from external atmosphere, as the gas is transformed into the plasma and comprising an output passage configured to deliver constituents of the plasma from the plasma chamber; and
a gas input manifold coupled to the enclosure and configured to introduce the gas into the plasma chamber; wherein
a longitudinal axis extends through the gas input manifold and through the plasma chamber;
the gas input manifold comprises a gas entry port in a manifold body, a gas chamber, and a plurality of channels, the gas entry port configured to couple to a gas supply and to introduce the gas to the gas chamber, the plurality of channels configured to direct the gas from the gas chamber downstream to the plasma chamber and to impart a radial velocity on the gas as the gas passes through the plurality of channels; wherein
at least one of the plurality of channels has a length and a cross-sectional geometry selected to inhibit arcing and plasma development within the gas channels;
the cross-sectional geometry of the at least one of the plurality of channels is configured to impart a first pressure on gas in the at least one of the plurality of channels; and
the plasma chamber is configured to impart a second pressure on gas in the plasma chamber; wherein
the first pressure is greater than the second pressure relative to the plasma chamber.

10. The remote plasma source of claim 9, wherein:
the cross-sectional geometry of the at least one of the plurality of channels varies from an upstream region having a first cross-sectional area to a downstream region having a second cross-sectional area that is greater than the first cross-sectional area.

11. The remote plasma source of claim 9, wherein at least one of:

the length and the cross-sectional geometry are selected to impart a reduced propensity for plasma formation in the at least one of the plurality of channels; or
the at least one of the plurality of channels comprises a relieved entry port and a relieved plasma chamber entrance, wherein the at least one of the plurality of channels is configured to mitigate local electric field concentration.

12. A remote plasma source configured to transform a gas passing therethrough into a plasma, the remote plasma source comprising:
an enclosure defining a plasma chamber, the enclosure configured to isolate the gas from external atmosphere, as the gas is transformed into the plasma and comprising an output passage configured to deliver constituents of the plasma from the plasma chamber; and
a gas input manifold coupled to the enclosure and configured to introduce the gas into the plasma chamber; wherein
a longitudinal axis extends through the gas input manifold and through the plasma chamber;
the gas input manifold comprises a gas entry port in a manifold body, a gas chamber, and a plurality of channels, the gas entry port configured to couple to a gas supply and to introduce the gas to the gas chamber, the plurality of channels configured to direct the gas from the gas chamber downstream to the plasma chamber and to impart a radial velocity on the gas as the gas passes through the plurality of channels; wherein
at least one of the plurality of channels comprises a first region having a first cross-sectional area, and a second region having a cross-sectional area that continuously increases from the first cross-sectional area to a second cross-sectional area.

13. The remote plasma source of claim 12, wherein:
the plurality of channels are configured to direct the gas from the gas chamber downstream to the plasma chamber and to impart a tangential velocity on the gas as the gas passes through the plurality of channels.

14. The remote plasma source of claim 12, wherein:
the gas input manifold is configured to impart a swirling effect on the gas exiting the plurality channels as the gas moves downstream towards the output passage.

15. The remote plasma source of claim 12, further comprising:
an electrode extending into the plasma chamber and configured to couple to a match circuit; wherein
the gas input manifold comprises an electrode insulator body configured to insulate the electrode from the plasma chamber and an enclosure insulator body configured to insulate the enclosure from the plasma chamber, the enclosure insulator body further configured to abut the electrode insulator body; and
the plurality of channels are defined by recesses placed in one or both of the electrode insulator body or the enclosure insulator body.

16. The remote plasma source of claim 15, wherein:
the gas chamber is defined by respective surfaces on the electrode insulator body, the enclosure insulator body, and the manifold body.

17. The remote plasma source of claim 12, wherein:
the gas entry port is configured to impart a first velocity to the gas;
the gas chamber is configured to slow the gas to a second velocity less than the first velocity; and the plurality of channels are configured to impart a third velocity to the gas, the third velocity greater than the second velocity.

18. The remote plasma source of claim 12, wherein:

the plurality of channels are configured to introduce the gas comprising a plurality of particles, each of the plurality of particles having a chamber residence time in the plasma chamber; and the remote plasma source is configured to inhibit deviation of the chamber residence time of the each of the plurality of particles from an average residence time of the plurality of particles.

19. The remote plasma source of claim 12, further comprising:

a plurality of electrodes configured to impart an electrical field in the plasma chamber; and at least one of the plurality of channels is configured to introduce the gas into the plasma chamber such that the gas moves in a direction that is perpendicular to the electrical field when plasma is in the plasma chamber.

20. A remote plasma source, comprising:

a gas input section for receiving a process gas;

a plasma region downstream of the gas input section, for transforming the process gas into a plasma;

an output section downstream of the plasma region, for releasing constituents of plasma formed by the plasma region;

a housing comprising an enclosure and a manifold body upstream of the enclosure, the manifold body having a gas entry port for receiving the process gas;

a cylindrical inner electrode having a length along a longitudinal axis and extending from the gas input section towards the plasma region;

an electrode insulator having a cylindrical recess for receiving the inner electrode and an outer profile having a flanged region upstream of a cylindrical outer surface of the cylindrical inner electrode;

an enclosure insulator disposed about the cylindrical outer surface of the inner electrode to form a plasma chamber between the outer surface of the inner electrode and an inner surface of the enclosure insulator, the enclosure insulator further having a flanged region positioned against the flanged region of the electrode insulator; wherein at least one of the flanged region of the electrode insulator or the flanged region of the enclosure insulator comprises a plurality of grooves therein, wherein a plurality of gas channels is formed between the flanged region of the electrode insulator and the flanged region of the enclosure insulator;

a portion of the manifold body is disposed about the flanged regions of the electrode insulator and the enclosure insulator, wherein a gas chamber is formed between the manifold body, the electrode insulator, and the enclosure insulator;

the plurality of gas channels are in fluid communication with the gas chamber and the plasma chamber; and wherein the plurality of channels extend radially and longitudinally relative to the longitudinal axis, wherein the plurality of channels are configured to impart a radial velocity on the process gas as the process gas is fed towards the plasma chamber.

* * * * *